(12) United States Patent
Gries

(10) Patent No.: US 6,326,126 B1
(45) Date of Patent: Dec. 4, 2001

(54) PHOTOCURABLE ELASTOMERIC MIXTURE AND RECORDING MATERIAL OBTAINED THEREFROM FOR THE PRODUCTION OF RELIEF PRINTING PLATES

(75) Inventor: Willi-Kurt Gries, Wiesbaden (DE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 08/585,217

(22) Filed: Jan. 11, 1996

Related U.S. Application Data

(63) Continuation of application No. 08/042,098, filed on Apr. 1, 1993, now abandoned.

(30) Foreign Application Priority Data

Apr. 4, 1992 (DE) ............................................. 42 11 391

(51) Int. Cl.$^7$ ..................................................... G03F 7/033
(52) U.S. Cl. ................................... 430/286.1; 430/282.1; 430/288.1; 430/306; 430/910; 522/110; 522/137; 522/148
(58) Field of Search ............................... 430/281.1, 306, 430/288.1, 286.1, 282.1, 910; 522/121, 110, 137, 142, 148; 525/314, 404, 294, 184, 105, 90, 91

(56) References Cited

U.S. PATENT DOCUMENTS

| | | | |
|---|---|---|---|
| 3,567,798 | 3/1971 | Haefele et al. | 525/294 |
| 3,652,720 | * 3/1972 | Wright | 525/91 |
| 3,764,639 | 10/1973 | Hsieh et al. | 525/314 |
| 4,042,386 | 8/1977 | Okai et al. . | |
| 4,272,608 | 6/1981 | Proskow | 430/288.1 |
| 4,294,731 | * 10/1981 | Allen | 106/184.1 |
| 4,446,220 | 5/1984 | Proskow | 430/286.1 |
| 4,517,279 | 5/1985 | Worns | 430/486.1 |
| 4,554,240 | 11/1985 | Schulz et al. | 430/285.1 |
| 4,603,171 | * 7/1986 | Hsieh et al. | 525/105 |
| 4,640,877 | 2/1987 | Schroder | 430/14 |
| 4,680,251 | 7/1987 | Schober | 430/306 |
| 4,916,045 | 4/1990 | Koch et al. | 430/270.1 |
| 4,940,650 | * 7/1990 | Kurtz et al. | 430/283.1 |
| 4,994,344 | 2/1991 | Kurtz et al. | 430/273.1 |
| 5,147,757 | 9/1992 | Kurtz et al. | 430/270.1 |
| 5,223,375 | 6/1993 | Berrier et al. | 430/281.1 |
| 5,250,390 | 10/1993 | Gries | 430/283.1 |
| 5,304,458 | 4/1994 | Berrier et al. | 430/300 |
| 5,348,844 | * 9/1994 | Wagner | 430/286.1 |

FOREIGN PATENT DOCUMENTS

| | | |
|---|---|---|
| 9016662 | 6/1991 | (DE) . |
| 0130828 | 1/1985 | (EP) . |
| 0137331 | 4/1985 | (EP) . |
| 0183552 | 6/1986 | (EP) . |
| 0251228 | 1/1988 | (EP) . |
| 0261910 | 3/1988 | (EP) . |
| 0273393 | 7/1988 | (EP) . |
| 0277418 | 8/1988 | (EP) . |
| 0430214 | 6/1991 | (EP) . |
| 0513493A1 | * 11/1992 | (EP) . |
| 1366769 | 9/1974 | (GB) . |
| 2179360 | 3/1987 | (GB) . |
| 80/506 | 1/1980 | (ZA) . |

OTHER PUBLICATIONS

Partial English–Translation of JP–A–1–183651, which was published on Jul. 21, 1989.*
Partial English–Translation of JP–A–5–150451, which was published on Jun. 18, 1993.*
STN; Chemical Abstracts Registry file RN 51821–82–0 for "Arkomona".*
*The Polymer Handbook*, 2nd Ed., Brandrup, J et al. ed (1975) John Wiley & Sons, Inc. pp. II—167—168.*
Chemical Abstracts, vol. 117, No. 12, Sep. 21, 1992, Columbus, Ohio, Abstract 112532, L. Liang et al., "Fabrication and characterization of (Poly(Styrene–Butadiene–4–Vinylpyridine) Triblockcopolymer" and G aofenzi Cailiao Kexue Gongcheng BD. 7, NR. 5, 1991, Seiten 17–22.
G. Sylvester UND P. Muller in Houben–Weyl–Muller, Methoden Der Organischen Chemie E 20/2, 798ff. (1987).
G. Schroden in Houben–Weyl–Muller, Methoden Der Organischen Chemie E 20/2, 1141ff. (1987).
P. REMPP, E. Franta UND J.–E. Herz, Adv. Polym. Sci. 86, (1988) pp 145–173.
G. Riess, G. Hurtrez Und P. Bahadur, Encycl. Polym. Polym. Sci. 2, 324–361, 415–420 (1985).
T. W. Greene, Protective Groups in Organic Synthesis, Wiley Interscience, New York 1981. pp 168–169.

* cited by examiner

Primary Examiner—Janis L. Dote
(74) Attorney, Agent, or Firm—Foley & Lardner

(57) ABSTRACT

The invention relates to a photocurable, negative-working mixture and a recording material which is obtained therefrom and which is suitable for the production of elastic relief printing plates. The mixture contains a) an elastomeric binder, b) a free-radical-polymerizable compound which is compatible with the binder and which has at least one terminal, ethylenically unsaturated group and a boiling point at normal pressure of over about 100° C. and c) a compound or a combination of compounds which are capable of initiating the polymerization of the compound (b) on exposure to actinic light. The binder is made up of the segments A, B and C, where A is a hydrophobic soft block having a glass transition temperature $T_g$ of below about −30° C.
B is a hydrophobic hard block having a glass transition temperature $T_g$ of over about +30° C. and
C is a polar block which is made up of vinyl monomers and/or heterocyclic compounds which can be polymerized by anionic ring opening.

34 Claims, No Drawings

PHOTOCURABLE ELASTOMERIC MIXTURE AND RECORDING MATERIAL OBTAINED THEREFROM FOR THE PRODUCTION OF RELIEF PRINTING PLATES

This is a continuation of copending application Ser. No. 08/042,098 filed on Apr. 1, 1993, now abandoned.

The invention relates to a photocurable negative-working mixture and a recording material which is obtained therefrom and which is suitable for the production of elastic relief printing plates, planographic printing plates and resist materials.

Mixtures of the generic type mentioned are known and usually contain an elastomeric binder, a free-radical-polymerizable compound and a polymerization initiator which can be activated by actinic radiation. Such mixtures, which are described, for example, in DE-A 22 15 090 (=GB-A 1 366 769) use as binders thermoplastic block copolymers composed of non-elastomeric and elastomeric blocks, the exposed printing form being developed to produce a relief image by organic solvents.

Although DE-A 27 25 730 (=U.S. Pat. No. 4,042,386), DE-A 30 03 011 (=ZA 80/506), DE-A 33 22 994 (=U.S. Pat. No. 4,554,240) and EP-A 0 130 828 describe recording materials developable in aqueous media and based on partially hydrolyzed polyvinyl acetate derivatives, the water resistance of such systems is low, with the result that use with water-dilutable printing inks is impossible. DE-A 30 12 841 (=U.S. Pat. No. 4,272,608) and DE-A 35 43 646 (=U.S. Pat. No. 4,916,045) EP-A 0 277 418, 0 261 910, 0 183 552, 0 251 228 and 0 273 393, and also GB-A 2 179 360, U.S. Pat. Nos. 4,517,279 and 4,446,220 therefore propose recording materials based on diene elastomers containing carboxyl groups. If the proportion of carboxyl groups is kept low in such systems, developability in aqueous media can only be achieved with difficulty and it is necessary to add a high proportion of polar monomers or auxiliaries, which result, in turn, in high cold-flow of the unexposed material. Although an increase in the carboxyl group content results in an improved developability in aqueous media, the rubber-elastic properties of these materials deteriorate for system reasons. In addition, the resistance to water-containing printing inks decreases.

In addition to the desire for environmentally friendly development of the relief layers, an improvement in the specific characteristics within the printing process is desirable. For example, if non-absorbent printing materials such as sheets of polyester, aluminum, PVC or PVDC are to be imprinted, an adequate ink coverage and ink drying speed can be achieved only by the presence of so-called "accelerators". These are usually organic solvents such as ethyl acetate, propyl acetate, acetone, methyl ethyl ketone, methyl isobutyl ketone etc., which can accelerate the drying process by rapid evaporation and, in addition, may have adhesion-promoting activity. The known "photopolymer" relief printing forms are, however, insufficiently resistant to such solvents, i.e. strong swelling of the relief layer reduces the reproduction quality and prevents a high printing run. DE-A 38 03 457 (=U.S. Pat. No. 4,994,344) describes sheet-like photo-sensitive recording materials which have beneficial swelling properties in relation to the accelerators mentioned. The binders used in such systems are so-called EPM and EPDM elastomers. Because of their saturated polymer main chain, these materials are largely nonpolar, with the result that compatibility problems frequently arise in the production of photopolymerizable recording materials. In this connection, this frequently deficient compatibility with olefinically unsaturated monomers, polymerization initiators, dyes, plasticizers and other additives results, as a rule, in products having inadequate processability and also poor mechanical and reproduction quality. As described, for example, in DE-A 39 05 947 (=U.S. Pat. No. 5,147,757) to improve the properties, it is necessary to incorporate so-called "compatibilizers", which, although they reduce the compatibility problem in such materials, which are described as blends, are, as a rule, unsuitable, or have to be described as extremely troublesome, in optically transparent systems owing to the formation of discreet phases.

Printing forms such as those described in DE-A 22 15 090 require ozone resistance. Ozone is produced, for example, during the imagewise exposure of the photopolymerizable elastomeric layer, in particular if UV light is used, but also when using the exposed and developed printing forms in a printing operation. Especially in the latter case, particularly high ozone concentrations occur, in particular if flexible packaging materials such as paper or plastics have to be imprinted. Since appreciable amounts of ozone are produced during corona treatment and corona treatment is most effective if it is carried out immediately prior to the printing process, the printing form comes into contact with ozone produced by this process to an appreciable extent. The susceptibility of the developed printing forms to ozone is increased still further because, in most cases, the printing form is post-treated with halogen or UV-C-radiation, which is necessary to reduce its tackiness.

In DE-A 22 15 090, waxes, certain thioureas, various polymers etc. are added to the photopolymer mixture to increase the ozone resistance. The disadvantage of this procedure is that the additives mentioned are often insufficient to ensure the required resistance to ozone, or if the active concentration of these additives is increased, the photopolymerizable mixture exhibits turbidities to such an extent that a perfect exposure can no longer be achieved. Other patents describe methods of post-treating the developed and treated printing form with, for example, Ni or Zn dialkyldithiocarbamates (EP-A 0 137 331), liquid polyethers (DE-A 35 12 632=U.S. Pat. No. 4,680,251) or polyamide solutions (DE-A 34 15 044=U.S. Pat. No. 4,640,877). Apart from the additional operational step, relief printing forms treated in this way frequently exhibit initial crack formations after a short exposure to air containing ozone.

The object of the invention was to propose binders for photosensitive elastomeric mixtures which, while retaining the thermoplastically elastic properties, can be tailored to suit the printing application.

Surprisingly, it has now been possible to achieve this object by using symmetrical or asymmetrical block copolymers having a segment composition adapted to the particular application purpose as binders.

The invention relates to a photocurable elastomeric mixture which contains:
a) an amphiphilic elastomeric binder or a mixture of such binders,
b) a free-radical-polymerizable compound which is compatible with the binder and which has at least one terminally ethylenically unsaturated group and a boiling point at normal pressure of over about 100° C. and
c) a compound or a combination of compounds which is capable of initiating the polymerization of compound (b) on exposure to actinic light and the binder is made up of the segments A, B and C, where
A is a hydrophobic, soft block having a glass transition temperature $T_g$ of below about −30° C., B is a hydrophobic hard block having a glass transition temperature $T_g$ of over about +30° C., C is a polar block which is made up of vinyl monomers and/or heterocyclic compounds which can be polymerized by anionic ring opening or a combination thereof.

These block copolymers may be built up in variety of ways, depending on which and how many of these segments the copolymer contains and how said segments are linked to one another. These block copolymers may, for example, have the following structures: A-B-C, A-B-A-C, or C-A-B-A-C. It is furthermore possible to build up the block C of various sub-blocks, by copolymerization of various monomers.

Suitable monomers for the block polymers A are conjugated dienes such as 1,3-butadiene, isoprene, 2,3-dimethyl-1,3-butadiene, 1,3-pentadiene, 2-methyl-3-ethyl-1,3-butadiene, 3-methyl-1,3-pentadiene, 2-methyl-3-ethyl-1,3-pentadiene, 2-ethyl-1,3-pentadiene, 1,3-hexadiene, 2-methyl-1,3-hexadiene, 1,3-heptadiene, 1,3-octadiene, 3,4-dimethyl-1,3-hexadiene and 2-phenyl-1,3-butadiene. The use of mixtures of suitable dienes or the use of other anionically polymerizable conjugated dienes containing 4 to 12 carbon atoms is also possible. Preferably, isoprene and 1,3-butadiene are used.

Suitable monomers for the segments B are vinyl aromatics, in particular styrene, alkyl styrene or vinylnaphthalene, styrene being particularly preferred.

The blocks C are built up of ethylenically unsaturated compounds such as methacrylates or vinyl pyridines. Examples of these are methyl, n-butyl, tert-butyl, octyl, lauryl, octadecyl, phenyl, and dimethylaminoethyl methacrylate, methacrylic acid, 2- or 4-vinyl pyridine or substituted vinyl pyridines. The blocks C may also be composed of heterocyclic components which can be polymerized by anionic ring opening, such as oxiranes, thietanes, lactones, cyclosiloxanes or lactams. As examples of these, mention may be made of ethylene oxide, propylene oxide, butylene oxide, phenyloxirane, ethylene sulfide, propylene sulfide, β-propiolactone, ε-caprolactone, hexamethylcyclotrisiloxane, octamethylcyclo-tetrasiloxane, pyrrolidone and ε-caprolactam. To synthesize the block C, one or more of tert-butyl methacrylate, ethylene oxide, ethylene sulfide, 4-vinylpyridine, ε-caprolactone and hexamethylcyclotrisiloxane is preferably used.

The block polymers described are prepared by methods known per se. Reference may be made here to G. Sylvester and P. Müller in Houben-Weyl-Müller, *Methoden der Oraganischen Chemie* E 20/2, 798 et seq. (1987) and G. Schröder in Houben-Weyl-Müller, *Methoden der Organischen Chemie* E20/2, 1141 et seq. (1987). The transformation methods for anionic ring opening and for anionic addition are described in P. Rempp, E. Franta and J.-E. Herz, Adv. Polym. Sci. 86, 145 (1988) and G. Riess, G. Hurtrez and P. Bahadur, *Encycl. Polym. Sci.* 2, 324 (1985). For the standard methods of protecting carboxyl groups, reference should be made to T. W. Greene, *Protective Groups in Organic Synthesis*, Wiley Interscience, New York 1981, 168/169.

To initiate the anionic polymerization, the standard organolithium compounds R—Li are used, R being understood as meaning aliphatic, cycloaliphatic, aromatic or mixed aliphatic/aromatic radicals. Particularly worthy of mention are, inter alia, methyllithium, ethyllithium, (n, sec-, tert-) butyllithium, isopropyllithium, cyclohexyllithium, phenyllithium and p-tolyllithium. In addition, bifunctional initiators which are active in nonpolar media such as those formed, for example, by free-radical coupling of diphenylethene by means of Li metal or by reaction of diisopropenylbenzenes with organo-Li compounds, may be used. Preferably, sec- or n-BuLi and 1,4-dilithio-1,1,4,4-tetraphenylbutane are used.

The copolymerization is carried out under the standard conditions for handling reagents which are extremely sensitive to moisture and oxygen, i.e. in particular that a dry inert gas atmosphere, for example a nitrogen or argon atmosphere, must be employed. The solvents used are aliphatic, cycloaliphatic and aromatic hydrocarbons such as isobutane, n-pentane, isooctane, cyclopentane, cyclohexane, cycloheptane, benzene, toluene or xylene, and also mixtures of said solvents. It is frequently expedient to work in the presence of dipolar aprotic solvents in order to ensure a regioselective reaction of the monomers and thus minimize the proportion of side-reaction products. (A reaction is described as "regio-selective" if, of two or more centers in a molecule which are capable of reaction, one reacts largely predominantly or exclusively.) Particularly preferred dipolar aprotic solvents are ethers such as, for example tetrahydrofuran, dimethoxyethane or methyl phenyl ether. To obtain particular properties of the products, it proves beneficial to start the anionic copolymerization in nonpolar aprotic solvents but, as the conversion progresses, to increase the polarity of the solvent by adding more strongly polar ethers. In this connection, the proportion by volume of the ethers may be over about 95% of the total solvent volume.

If methacrylates are used to synthesize the C block, the anionic chain ends frequently have too strong a nucleophilic nature. Prior to the further copolymerization, a reduction in the nucleophilic nature of the anionic chain end is therefore expedient. This can be achieved by adding unsaturated compounds of the formula $CH_2=CR^1R^2$. Here $R^1$ and $R^2$ are aryl or alkylaryl groups, in particular, however, optionally substituted phenyl groups. Nevertheless, 1-phenyl-1-naphthylethene and its derivatives can also be used. Styrenes ($R^1$=optionally substituted phenyl, $R^2$=H or $C_1$–$C_6$-alkyl) are also suitable in some cases.

For the anionic ring opening of the heterocyclic monomers under C, it may be beneficial to convert the relevant chain end into the corresponding alcoholate or thiolate using ethylene oxide or ethylene sulfide.

The block copolymerization is carried out in a known way by sequential addition of the various monomers. In this connection, the reaction is conducted in such a way that the vinyl compounds needed to synthesize successive blocks are only added after substantial reaction of the monomers already present. The reaction temperature is set at between about −80° C. and 120° C. It is very strongly dependent on the nature of the particular monomer. Preferably, temperatures vary between about −72° C. and 60° C. After completion of the desired block synthesis, the polymeric anions can be deactivated using proton sources such as alcohols, water, ammonium chloride or HCl.

Molecular weights determined by gel permeation chromatography (GPC) vary between about 2,000 g/mol and 2,000,000 g/mol, preferably between about 15,000 g/mol and 200,000 g/mol. The proportions by mass of the block components involved vary from 20 to 98% by weight for A, from 1 to 50% by weight for B and from 1 to 50% by weight for C.

The photosensitive mixtures according to the invention generally contain from about 20 to 95% by weight, preferably from about 30 to 90% by weight, of the binder either exclusively or in combination with other polymeric materials. Such polymeric materials may be chlorinated or chlorosulfonated polyethylene compounds, randomly structured or segmented diene polymers or copolymers, and also suitable thermoplastic elastomers which can be prepared by polyaddition or polycondensation. They furthermore contain at least one free-radical-polymerizable olefinically unsaturated compound, and also at least one photoinitiator.

Suitable monomers containing one or more polymerizable olefinic double bonds are, in particular, esters and amides of acrylic, methacrylic, fumaric and maleic acid, and also mixtures of these compounds. Additionally, the alcohols or amines needed for ester or amide formation may contain further functionalities, for example ether units, hydroxyl groups, or primary, secondary or tertiary amino groups. Examples of alcohols suitable for ester formation are open-chain and cyclic alkanols such as butanol, hexanol, octanol, decanol, dodecanol, octadecanol, 2-ethylhexanol, cyclohexanol or borneol, and also oligo- or polybutadienes containing hydroxyl groups and oligo- or polyisoprenes containing hydroxyl groups. Other suitable alcohols are alkane diols, polyfunctional alcohols and similar compounds, for example 1,4-butanediol or 1,6-hexanediol, (poly)ethylene glycol or (poly)propylene glycol, glycerol, trimethylol propane, butanetriol, pentaerythritol etc. The di- or polyfunctional alcohols may be partially or completely esterified. Other examples of unsaturated compounds are specific esters and amides of (meth)acrylic acid, for example dimethylamino-ethyl (meth) acrylate, dimethylamino-propyl (meth)acrylamide, 2-butylaminoethyl (meth)acrylate, ethylenebis (meth)acrylamide, hexamethylenebis-(meth)acrylamide, diethylenetriamintris(meth)acrylamide, hydroxymethyl (meth)acrylamide and bishydroxyethyl(meth)acrylamide.

The amount of monomer is generally about 5 to 70% by weight, preferably about 10 to 50% by weight, of the non-volatile constituents of the mixture.

Suitable photoinitiators for the mixtures according to the invention are those known compounds which have an adequate thermal stability in the processing of the recording materials and an adequate free-radical formation during exposure to initiate the polymerization of the monomers. They should absorb light to form free radicals in the wavelength range from approximately 250 nm to 500 nm. Examples of suitable photoinitiators are acyloins and their derivatives such as benzoin, benzoin alkyl ether, 1,2-diketones and their derivatives, for example benzil, benzil acetals such as benzil dimethyl ketal, fluorenones, thioxanthones, polynuclear quinones, acridines and quinoxalines, and furthermore trichloro-methyl-s-triazines, 2-halomethyl-4-vinyl-1,3,4-oxadiazol, haloxazols substituted with trichloromethyl groups, carbonyl methylene heterocycles containing trihalomethyl groups, acylphosphine oxide compounds, and other phosphorus-containing photoinitiators, for example 6-acyl-6H-dibenzo[c,e][1,2] oxaphosphorine 6-oxides in particular 6-(2,4,6-trimethylbenzoyl)-6H-dibenzo[c,e]-[1,2]oxaphosphorine 6-oxide. The photoinitiators may also be used in combination with one another or with coinitiators or activators, for example with Michler's ketone and its derivatives or 2-alkylanthraquinones. The amount of photoinitiator is generally about 0.01 to 10% by weight, preferably about 0.5 to 5% by weight, of the recording material.

It is often advantageous to add further auxiliaries and additives to the recording material, for example those which inhibit thermal polymerization such as hydroquinone and its derivatives, 2,6-di-tert-butyl-p-cresol, nitro-phenols, nitrosamines such as N-nitrosodiphenylamine or salts of N-nitrosocyclohexylhydroxylamine, for example its alkali-metal or aluminum salts. Other standard additives are dyestuffs, pigments, processing aids and plasticizers.

The mixtures according to the invention can be processed to form layers having a thickness of 0.02 to 6 mm, preferably of 0.2 to 3 mm, by casting from solution or extrusion and calendering in order to produce relief printing plates and flexographic printing plates. The layer can be laminated onto the surface of a suitable substrate or a solution of the mixtures according to the invention can be applied directly to a layer substrate.

The mixtures according to the invention can be used not only to produce relief printing plates but also, for example, to produce planographic printing plates, gravure cylinders, screen printing stencils and photoresists.

Depending on the application purpose, suitable substrates are, for example, polyester sheets, steel and aluminum sheets, copper cylinders, screen printing stencil substrates, foam layers, rubber-elastic substrates or printed circuit boards. It may also be advantageous to apply a covering or protective layer, for example a thin layer of polyvinyl alcohol or polyamide, or a peelable covering sheet, for example composed of polyethylene terephthalate, to the photosensitive recording layer. A precoating of the substrate may furthermore be advantageous. The additional layer between the substrate and the photosensitive layer may act, for example, as a halo-protection layer or as an adhesion layer.

The recording materials according to the invention can be imagewise exposed to actinic light from light sources such as mercury vapor lamps or fluorescent tubes, the emitted wavelengths preferably being between 300 and 420 nm. The unexposed and uncrosslinked portions of the layer can be removed by spraying, washing or brushing with water or basic aqueous solutions. Suitable basic materials are, for example, hydroxides, carbonates or hydrocarbonates of the alkali metals, ammonia and organic amines. Furthermore, wetting and emulsifying agents, and also organic solvents which are miscible with water, for example aliphatic alcohols, ethylene glycols and ethylene glycol moncethers may be added. The proportion of basic components in the solution is generally 0.01 to 5% by weight, preferably 0.1 to 1% by weight. At the same time, the proportion of organic solvent is less than about 40% by weight, preferably less than about 20% by weight.

Alternatively, organic solvents such as aromatic hydrocarbons, chloroalkanes and ketones may also be used as developers. Examples of these are toluene, xylene, 1,1,1-trichloroethane, tetrachloroethylene, methyl isobutyl ketone etc., which may also be used in combination with lower alcohols, for example n-butanol. Expediently, the developed relief forms are dried at temperatures of up to 120° C. and optionally post-treated photochemically or chemically.

The recording materials according to the invention are particularly suitable for producing printing forms, especially for flexographic printing or planographic printing.

The invention is illustrated by the examples below. Unless otherwise specified, percentage data are percentage by weight data.

Preparation of the Block Copolymers

Preparation Examples 1 and 2
(Silicone, Block)

The S—I—S polymer section is prepared in the standard manner. For this purpose, 270 ml of anhydrous toluene or cyclohexane are placed in a dry, repeatedly evacuated glass apparatus ventilated with pre-dried nitrogen, 248 mmol of dry styrene are added followed by 2.50 ml of a 1.6 M n-BuLi solution in hexane. The polymerization commences after a short time. The solution is then temperature-controlled to 30° C. for 1 hour, 1.13 mol of isoprene are added and stirring is carried out for 3 hours in a closed apparatus at a heating bath temperature of 30° C. After adding a further 248 mmol of styrene and stirring for 1 hour at 30° C., 144 mmol of hexamethylcyclotrisiloxane in 270 ml of THF are added in order to introduce the siloxane block. The colorless reaction mixture is temperature-controlled to 50° C. for a further 20 hours, 1 mol % of 2,6-di-tert-butyl-4-hydroxytoluene is then added, and the mixture is sprayed into ten times its volume of methanol to precipitate the polymer, isolated and dried.

1 S—I—S—Si$_6$ (16/48/16/20%), yield=90%, GPC (THF): Mp (RI)=61000, D=1.05, Iodine number=186 g I$_2$/100 g 2 S—I—S—Si$_6$ (8/64/8/20%), yield=85%, GPC (THF): Mp (RI)=53000, D=1,17, Iodine number=204 g I$_2$/100 g Preparation Examples 3 to 5
(Polyester Block)

The S—I—S-anion block is synthesized analogously to the preparation Examples 1 and 2. After completing the last styrene step, an amount of THF equivalent to the toluene or the cyclohexane is added and cooling is carried out to below 10° C. with an ice/water mixture. 10 equivalents (based on the polymerization initiator) of ethylene oxide are added, stirring is carried out while maintaining cooling for 30 minutes, the appropriate amount of ε-caprolactone is added and finally heating is carried out in the closed reaction vessel for 11 hours at 50° C. The viscous reaction mixture is stabilized with 2,6-di-tert-butyl-4-hydroxytoluene and precipitated or isolated by spraying into methanol.

3 S—I—S—ε-CL (16/48/17/20%), yield=93%, GPC (THF): Mp (RI)=62000, D=1.06, Iodine number=158 g I$_2$/100 g 4 S—I—S—ε-CL (10/50/10/30%), yield=70%, GPC (THF): Mp (RI)=100000, D=1.03, Iodine number=243 g I$_2$/100 g 5 S—I—S—ε-CL (8/64/8/20%), yield=77%, GPC (THF): Mp (RI)=53000, D=1.01, Iodine number=247 g I$_2$/100 g Preparation Example 6
(Ethylene Glycol Block)

The reaction is carried out in the same way as in Examples 3, 4 and 5, but the ethylene oxide polymerization takes place for 15 h in a closed apparatus at room temperature.

6 S—I—S—EO (8/64/8/20%), yield=67%, GPC (THF): Mp (RI)=164000, D=1.08, Iodine number=243 g I$_2$/100 g Preparation Examples 7 and 8
(Ethylene Sulfide Block)

The reaction is carried out in the same way as in Examples 3, 4 and 5, but the ethylene sulfide polymerization takes place for 17 h at room temperature, and, in addition, 1,2-dimethoxyethane is used instead of THF as solvent.

7 S—I—S—ES (8/64/8/20%), yield=88%, GPC (THF): Mp (RI)=62000, D=1.09

8 S—I—S—ES (8/74/8/10%), yield=87%, GPC (THF): Mp (RI)=122000, D=1.09

Preparation Example 9
(Vinylpyridine Block)

The reaction is carried out in the same way as in Examples 3, 4 and 5, but the 4-vinylpyridine polymerization takes place for 19 hours at room temperature, cooling being carried out with an ice/water mixture before the monomer is added.

9 S—I—S-4-VP (8/64/8/20%), yield=93%, GPC (THF): Mp (RI)=70000, D=1.22

Preparation Example 10
(Tert-butyl Methacrylate Block)

The S—I—S-anion block is synthesized analogously to Preparation Examples 1 and 2. After completion of the last styrene step, 2 equivalents (based on the polymerization initiator) of 1,1-diphenylethene are added, a volume of THF appropriate to the amount of toluene or cyclohexane is added and cooling is carried out to an internal temperature below 10° C. using an ice/water mixture. While maintaining cooling, the calculated amount of tert-butyl methacrylate is added, stirring is carried out for a further 1 hour and methanol is used for termination. Stabilization and working up correspond to Preparation Example 1.

10 S—I—S-tBuMA (8/64/8/20%), yield=89%, GPC (THF): Mp (RI)=71000, D=1.19

Preparation Examples 11 to 13
(Amphoteric Methacrylate Block)

The S—I—S-anion block is synthesized analogously to Preparation Examples 1 and 2. After completion of the styrene polymerization, 2 equivalents (based on the polymerization initiator) of 1,1-diphenylethene are added, dilution is carried out with 300 ml of THF, stirring is carried out for 15 minutes at room temperature and the mixture is then cooled to −72° C. The calculated amount of tert-butyl methacrylate is first added to the dark-red viscous reaction mixture and stirring is carried out in a cold bath for 1 hour. N,N-dimethylaminoethyl methacrylate is added in accordance with the desired composition. The reaction mixture is left for a further 1 hour in the cold bath and methanol is used for termination at −72° C. Stabilization and working-up are carried out as described for 1 and 2. To remove the tert-butyl protective group, the material isolated is dissolved in toluene, 5% by weight of p-toluene sulfonic acid, based on the proportion of tert-butyl methacrylate are added, and heating is carried out for 6 hours at 80° C. After cooling, precipitation is carried out with MeOH, and the precipitate is washed and dried in vacuo at room temperature.

11 S—I—S-MMA-DMAEMA (8/64/8/10/10%), yield= 97%, GPC (THF): Mp (RI)=100000, D=1.14

12 S—I—S-MMA-DMAEMA (22/16/22/30/10%), yield= 77 %, GPC (THF): Mp (RI)=87000, D 1.32

13 S—I-MMA-DMAEMA, (10/70/10/10%), yield=99%, GPC (THF): Mp (RI)=45000, D=1.20

The abbreviations used above, if they are not in general use, have the following meaning:
S=styrene
I=isoprene
Si$_6$=hexamethylcyclotrisiloxane
DMAEMA=dimethylaminoethyl methacrylate
4-VP=4-vinylpyridine
ε-CL=ε-caprolactone
EO=ethylene oxide
ES=ethylene sulfide
tBuMA=tert-butyl methacrylate
MMA=methyl methacrylate The GPC investigations were carried out in tetrahydrofuran with a polystyrene standard as reference molecular weight.

EXAMPLES 1 to 13
(Preparation of Flexograghic Printing Plates)

The products specified in the following tables were homogenized in the amounts, which are also specified, in a kneader (Brabender Plasticorder) at 80 rev/min and at a temperature of 120° C. The resultant clear material was then pressed in a platen press at 120° C. for 1.5 minutes at 15 bar and 2 minutes at 35 bar to a total layer thickness of 3 mm between two 0.125 mm thick polyester sheets, one of them provided with an adhesion layer, the other with a water-soluble anti-tack layer or, alternatively, with an anti-tack layer which is soluble in organic solvents. After rear-side exposure for 20 seconds, imagewise exposure was carried out for 8 minutes in a UV-A flat-bed exposure apparatus and stripping was then carried out in the solvents specified in Table V in the course of 8 minutes using a flat-brush development apparatus at 60° C. or room temperature.

The post-exposed printing plates have the Shore A hardnesses (30 s) specified in Tables I to IV and yielded in water, ethanol or a mixture of 85 parts of ethanol and 15 parts of ethyl acetate the specified swelling values expressed as a relative increase in weight by % after 24 hours.

The cases in which stripping takes place are denoted by +, the cases in which no stripping takes place by –, while o denotes partial stripping.

The flexographic printing plates according to Examples 4 to 10 were tested, in addition, for their resistance to exposure to ozone in accordance with the method described in Example 1 of DE-A 38 41 854 (exposure time 37 or 72 hours at room temperature).

TABLE I

| Composition | Comparison Example | Examples 2 | Examples 3 |
|---|---|---|---|
| Polymer in accordance with Example 6 | — | — | 25.65 |
| Polymer in accordance with Example 7 | — | 25.65 | — |
| Block copolymer composed of S-I-S (® Europrene Sol T 190) | 25.65 | — | — |
| Hexanediol diacrylate | 1.2 | 1.2 | 1.2 |
| Hexanediol dimethacrylate | 0.6 | 0.6 | 0.6 |
| 2,6-di-tert-butyl-4-methylphenol | 0.3 | 0.3 | 0.3 |
| Benzil dimethyl ketal | 0.45 | 0.45 | 0.45 |
| Solvent Black HB | 0.003 | 0.003 | 0.003 |
| Medical white oil | 1.8 | 1.8 | 1.8 |
| Properties | | | |
| Hardness (Shore A/30s) | 21 | 30 | 26 |
| Swelling (%) | | | |
| $H_2O$ | 0.40 | 0.65 | 0.53 |
| EtOH | — | — | — |
| EtOH/EtOAc (85/15) | 2.67 | 5.21 | 4.05 |

TABLE II

| Compostion | Examples 4 | Examples 5 | Examples 6 |
|---|---|---|---|
| Polymer in accordance with Example 6 | — | — | 20.4 |
| Polymer in accordance with Example 7 | — | 20.4 | — |
| Polymer in accordance with Example 9 | 20.4 | — | — |
| Tripropylene glycol diacrylate | 3.0 | 3.0 | 3.0 |
| Mono-2-acryloyloxy-ethylene maleate | 1.5 | 1.5 | 1.5 |
| Benzil dimethyl ketal | 0.3 | 0.3 | 0.3 |
| Solvent Black HB | 0.0003 | 0.0003 | 0.0003 |
| Liquid polyisoprene containing COOH | 2.85 | 2.85 | 2.85 |
| Medical white oil | 1.8 | 1.8 | 1.8 |
| Properties | | | |
| Hardness (Shore A/30s) | 27 | 42 | 32 |
| Swelling (%) | | | |
| $H_2O$ | 1.37 | 0.58 | 0.83 |
| EtOH | 4.63 | 0.79 | 1.05 |
| EtOH/EtOAc (85/15) | 12.1 | 4.4 | 5.01 |
| EtOH/EtOAC (50/50) | 35.1 | 19.4 | 21.7 |
| EtOH/EtOAc/MEK (50/25/25) | 35.7 | 19.4 | 18.9 |

TABLE III

| Composition | Examples 7 | Examples 8 | Examples 9 | Examples 10 |
|---|---|---|---|---|
| Polymer in accordance with Example 2 | — | — | 25.5 | — |
| Polymer in accordance with Example 4 | — | 25.5 | — | — |
| Polymer in accordance with Example 9 | — | — | — | 25.5 |
| Polymer in accordance with Example 10 | 25.5 | — | — | — |
| Hexanediol diacrylate | 1.2 | 1.2 | 1.2 | 1.2 |
| Hexanediol dimethyacrylate | 0.6 | 0.6 | 0.6 | 0.6 |
| Benzil dimethyl ketal | 0.45 | 0.45 | 0.45 | 0.45 |
| Solvent Black HB (Solvent Black 3) | 0.0003 | 0.0003 | 0.0003 | 0.0003 |
| Medical white oil | 1.8 | 1.8 | 1.8 | 1.8 |
| 2,6-di-tert-butyl-4-methylphenol | 0.3 | 0.3 | 0.3 | 0.3 |
| Properties | | | | |
| Hardness (Shore A/30s) | 24 | 10 | 7.0 | 32 |
| Swelling (%) | | | | |
| $H_2O$ | 0.11 | — | 0.11 | 0.80 |
| EtOH | 15.7 | 1.04 | — | 4.86 |
| EtOH/EtOAc (85/15) | 55.9 | 7.80 | 4.07 | 13.8 |

TABLE IV

| Compostion | Examples 11 | Examples 12 | Examples 13 |
|---|---|---|---|
| Polymer in accordance with Example 13 | 19.2 | 19.2 | 19.2 |
| Benzil dimethyl ketal | 0.3 | 0.3 | 0.3 |
| 2,6-di-tert-butyl-4-methylphenol | 0.15 | 0.15 | 0.15 |
| Medical white oil | 3.0 | 3.0 | 3.0 |
| Liquid polyisoprene containing COOH | 2.85 | 2.85 | 2.85 |
| Tripropylene glycol diacrylate | 3.0 | 3.0 | 3.0 |
| Dimethylaminopropyl-methacrylamide | 1.5 | — | — |
| Mono-2-acryloyloxy-ethylene maleate | — | 1.5 | — |
| Hexanediol dimethacrylate | — | — | 1.5 |
| Properties | | | |
| Hardness (Shore | 21 | 31 | 30 |

TABLE IV-continued

| | Examples | | |
|---|---|---|---|
| Compostion | 11 | 12 | 13 |
| A/30s) Swelling (%) | | | |
| H₂O | 0.83 | 1.14 | 0.76 |
| EtOH | 5.28 | 3.24 | 3.65 |
| EtOH/EtOAC (85/15) | 17.2 | 11.1 | 12.9 |

TABLE V

| | Examples | | | | | | | | | | | | |
|---|---|---|---|---|---|---|---|---|---|---|---|---|---|
| Stripping | CE | 2 | 3 | 4 | 5 | 6 | 7 | 8 | 9 | 10 | 11 | 12 | 13 |
| Organic solvent (®) Solvesso 100) | + | + | + | + | + | + | + | + | + | + | + | + | + |
| 1%-strength acetic acid | – | – | – | + | – | – | – | – | – | – | – | – | – |
| Water | – | – | – | – | – | – | – | – | – | – | – | – | – |
| 5%-strength Na dodecyl-benzenesulfonate in 1%-strength NaOH | – | – | – | – | – | – | – | – | – | – | – | + | o |
| ® Arkomon A* 5%-strength, in 1%-strength NaOH | – | – | – | – | – | – | – | – | – | – | – | – | – |
| ® Arkomon A* 5%-strength, in water | – | – | – | – | – | – | – | – | – | – | + | + | + |

CE comparison Example
+ stripping
– no stripping
o partial stripping
*® Arkomon A is the sodium salt of oleoyl sarcoside. The formula of oleoyl sarcoside sodium salt if $H_3C-[CH_2]_7-CH=CH-[CH_2]_7-CO-N(CH_3)-CH_2-CO_2Na$ The parent compound, sarcosine, is also referred to as N-methyl-glycine. The commercial product further contains about 40% by weight of water.

®Arkomon A is the sodium salt of oleoyl sarcoside. The formula of oleoyl sarcoside sodium salt is

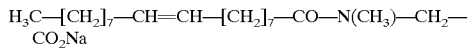

The parent compound, sarcosine, is also referred to as N-methyl-glycine. The commercial product further contains about 40% by weight of water.

EXAMPLES 14 and 15
(Offset Printing Plates)

A coating solution composed of
  6.59 g of the block copolymer synthesized in accordance with Preparation Example 11 containing a proportion of 16% styrene, 74% isoprene and 10% N,N-dimethylaminoethyl methacrylate,
  6.59 g of trimethylolpropane triacrylate,
  0.118 g of phenylacridine,
  0.141 g of Samaron Navy Blue HR (Disperse Blue 290),
  0.118 g of dibenzalacetone and
  400 g of tetrahydrofuran
was applied to a 0.3 mm thick aluminum substrate which had been grained in nitric acid, anodized in sulfuric acid and post-treated with a 0.1%-strength aqueous solution of polyvinylphosphonic acid. The layer weight was 1.0 g/m². The plate was then coated with a 3.5%-strength aqueous solution of a polyalkylene oxide/polyvinyl alcohol graft polymer (Hoechst: (R)Mowiol 04/Ml) (layer weight after drying 0.8 g/m²). The printing plate obtained was exposed for 40 s using a 5 kW metal halide lamp at a distance of 110 cm with an exposure wedge and also various other test elements comprising microlines and small dot patches. After exposure, the plate was treated with a developer (5%-strength Na dodecylbenzene-sulfonate in a 1%-strength sodium carbonate solution) using a plush pad.

The unexposed layer regions were removed cleanly within a few seconds, a copy with a very high resolution and good ink absorption being obtained.

Equally good results were obtained with a printing plate coated with the following mixture:
  4.80 g of the block copolymer synthesized in accordance with Preparation Example 12 containing a proportion of 44% styrene, 16% isoprene, 30% methacrylic acid and 10% dimethylaminoethyl methacrylate,
  4.00 g of trimethylolpropane triacrylate,
  0.700 g of N,N-dimethylaminopropylmethacrylamide,
  0.150 g of benzil dimethyl ketal,
  0.050 g of 2,6-di-tert-butyl-4-methylphenol,
  0.010 g of Solvent Black HB and
  104 g of tetrahydrofuran.

The layer weight of the photosensitive layer was 3.5 g/m².

What is claimed is:
1. A photocurable elastomeric mixture comprising:
a) an amphiphilic elastomeric binder or a mixture of such binders,
b) a free-radical-polymerizable compound which is compatible with the binder and which has at least one terminally ethylenically unsaturated group and a boiling point at normal pressure of over 100° C. and
c) a compound or a combination of compounds which is capable of initiating the polymerization of the compound (b) on exposure to actinic light,
wherein the elastomeric binder is a block copolymer made up of the segments A, B and C, where
  A is a hydrophobic soft polymer block having a glass transition temperature of below –30° C.,
  B is a hydrophobic hard polymer block having a glass transition temperature of over +30° C.,
  C is a polar polymer block which is made up of heterocyclic compounds which can be polymerized by anionic ring opening, and wherein the block copolymer has one of the following structures: A—B—C, A—B—A—C or C—A—B—A—C.

2. A photocurable elastomeric mixture as claimed in claim 1, wherein, in the elastomeric block copolymer which serves as binder, soft polymer blocks A are formed from conjugated dienes, hard polymer blocks B from vinyl aromatics and polar blocks C from oxiranes, thietanes, lactones, cyclosiloxanes or lactams.

3. A photocurable elastomeric mixture as claimed in claim 2, wherein the conjugated diene is 1,3-butadiene, isoprene or 2,3-dimethyl-1,3-butadiene.

4. A photocurable elastomeric mixture as claimed in claim 2, wherein the vinyl aromatic is styrene.

5. A photocurable elastomeric mixture as claimed in claim 1, wherein polymer blocks C are made up of one or more of ethylene oxide, ethylene sulfide, ε-caprolactone or hexamethylcyclotrisiloxane.

6. A photocurable elastomeric mixture as claimed in claim 1, wherein the block copolymer which serves as binder has a molecular weight $M_p$ of between about 15,000 and 200,000 g/mol.

7. A photocurable elastomeric mixture as claimed in claim 1, which contains 20 to 95% by weight of elastomeric block copolymer (a), 5 to 70% by weight of polymerizable compounds (b) and 0.01 to 10% by weight of photopolymerization initiator (c), in each case based on the total weight of the non-volatile constituents of the mixture.

8. A photocurable elastomeric mixture as claimed in claim 7, which contains 30 to 90% by weight of the elastomeric block copolymer, based on the total weight of the non-volatile constituents of the mixture.

9. A photocurable elastomeric mixture as claimed in claim 7, which contains 10 to 50% by weight of the polymerizable compounds, based on the total weight of the non-volatile constituents of the mixture.

10. A photocurable elastomeric mixture as claimed in claim 7, which contains 0.5 to 5% by weight of the photopolymerizable initiator, based on the total weight of the non-volatile constituents of the mixture.

11. A photocurable recording material having a substrate and a photocurable layer, wherein the photocurable layer is composed of a mixture in accordance with claim 1.

12. A photocurable recording material as claimed in claim 11, wherein the photocurable layer is developable with water, basic aqueous solutions or organic solvents following imagewise exposure of the recording material.

13. A photocurable recording material as claimed in claim 11, wherein the photocurable layer is developable with water or a basic aqueous solution following imagewise exposure of the recording material.

14. A photocurable elastomeric mixture as claimed in claim 1, wherein the elastomeric block copolymer which serves as the binder comprises based on the total weight of the block copolymer of 20 to 98% by weight of polymer-blocks A, of 1 to 50% by weight of polymer blocks B and of 1 to 50% by weight of polymer blocks C.

15. A photocurable elastomeric mixture comprising:
 a) an amphiphilic elastomeric binder or a mixture of such binders,
 b) a free-radical-polymerizable compound which is compatible with the binder and which has at least one terminally ethylenically unsaturated group and a boiling point at normal pressure of over 100° C. and
 c) a compound or a combination of compounds which is capable of initiating the polymerization of the compound (b) on exposure to actinic light,
 wherein the elastomeric binder is a block copolymer made up of the segments A, B and C, where
  A is a hydrophobic soft polymer block having a glass transition temperature of below −30° C.,
  B is a hydrophobic hard polymer block having a glass transition temperature of over +30° C.,
  C is a polar polymer block which is made up of heterocyclic compounds which can be polymerized by anionic ring opening, and
 wherein the elastomeric binder is S—I—S—EO.

16. A photocurable elastomeric mixture as claimed in claim 15, wherein the block copolymer which serves as binder has a molecular weight $M_p$ of between about 15,000 and 200,000 g/mol.

17. A photocurable elastomeric mixture as claimed in claim 15, which contains 20 to 95% by weight of elastomeric block copolymer (a), 5 to 70% by weight of polymerizable compounds (b) and 0.01 to 10% by weight of photopolymerization initiator (c), in each case based on the total weight of the non-volatile constituents of the mixture.

18. A photocurable elastomeric mixture as claimed in claim 17, which contains 30 to 90% by weight of the elastomeric block copolymer, based on the total weight of the non-volatile constituents of the mixture.

19. A photocurable elastomeric mixture as claimed in claim 17, which contains 10 to 50% by weight of the polymerizable compounds, based on the total weight of the non-volatile constituents of the mixture.

20. A photocurable elastomeric mixture as claimed in claim 17, which contains 0.5 to 5% by weight of the photopolymerizable initiator, based on the total weight of the non-volatile constituents of the mixture.

21. A photocurable recording material having a substrate and a photocurable layer, wherein the photocurable layer is composed of a mixture in accordance with claim 15.

22. A photocurable recording material as claimed in claim 21, wherein the photocurable layer is developable with water, basic aqueous solutions or organic solvents following imagewise exposure of the recording material.

23. A photocurable recording material as claimed in claim 21, wherein the photocurable layer is developable with water or a basic aqueous solution following imagewise exposure of the recording material.

24. A photocurable elastomeric mixture as claimed in claim 15, wherein the elastomeric block copolymer which serves as the binder comprises based on the total weight of the block copolymer of 20 to 98% by weight of polymer blocks A, of 1 to 50% by weight of polymer blocks B and of 1 to 50% by weight of polymer blocks C.

25. A photocurable elastomeric mixture comprising:
 a) an amphiphilic elastomeric binder or a mixture of such binders,
 b) a free-radical-polymerizable compound which is compatible with the binder and which has at least one terminally ethylenically unsaturated group and a boiling point at normal pressure of over 100° C. and
 c) a compound or a combination of compounds which is capable of initiating the polymerization of the compound (b) on exposure to actinic light,
 wherein the elastomeric binder is a block copolymer made up of the segments A, B and C, where
  A is a hydrophobic soft polymer block having a glass transition temperature of below −30° C.,
  B is a hydrophobic hard polymer block having a glass transition temperature of over +30° C.,
  C is a polar block which is made up of heterocyclic compounds which can be ploymerized by anionic ring opening, and wherein the elastomeric binder is S—I—S—Si$_6$, S—I—S-ϵ-CL or S—I—S—ES.

26. A photocurable elastomeric mixture as claimed in claim 25, wherein the block copolymer which serves as binder has a molecular weight $M_p$ of between about 15,000 and 200,000 g/mol.

27. A photocurable elastomeric mixture as claimed in claim 25, which contains 20 to 95% by weight of elastomeric block copolymer (a), 5 to 70% by weight of polymerizable compounds (b) and 0.01 to 10% by weight of photopolymerization initiator (c), in each case based on the total weight of the non-volatile constituents of the mixture.

28. A photocurable elastomeric mixture as claimed in claim 27, which contains 30 to 90% by weight of the elastomeric block copolymer, based on the total weight of the non-volatile constituents of the mixture.

29. A photocurable elastomeric mixture as claimed in claim 27, which contains 10 to 50% by weight of the polymerizable compounds, based on the total weight of the non-volatile constituents of the mixture.

30. A photocurable elastomeric mixture as claimed in claim 27, which contains 0.5 to 5% by weight of the photopolymerizable initiator, based on the total weight of the non-volatile constituents of the mixture.

31. A photocurable recording material having a substrate and a photocurable layer, wherein the photocurable layer is composed of a mixture in accordance with claim 25.

32. A photocurable recording material as claimed in claim 31, wherein the photocurable layer is developable with water, basic aqueous solutions or organic solvents following imagewise exposure of the recording material.

33. A photocurable recording material as claimed in claim 31, wherein the photocurable layer is developable with water or a basic aqueous solution following imagewise exposure of the recording material.

34. A photocurable elastomeric mixture as claimed in claim 25, wherein the elastomeric block copolymer which serves as the binder comprises based on the total weight of the block copolymer of 20 to 98% by weight of polymer blocks A, of 1 to 50% by weight of polymer blocks B and of 1 to 50% by weight of polymer blocks C.

* * * * *